United States Patent
Shim

(10) Patent No.: US 7,883,928 B2
(45) Date of Patent: Feb. 8, 2011

(54) IMAGE SENSOR AND FABRICATING METHOD THEREOF

(75) Inventor: Cheon Man Shim, Yeongdeungpo-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 562 days.

(21) Appl. No.: 11/858,306

(22) Filed: Sep. 20, 2007

(65) Prior Publication Data

US 2008/0150053 A1 Jun. 26, 2008

(30) Foreign Application Priority Data

Dec. 22, 2006 (KR) .................. 10-2006-0132387

(51) Int. Cl.
*H01L 21/00* (2006.01)

(52) U.S. Cl. .................. 438/82; 438/75; 438/144; 257/E27.13

(58) Field of Classification Search .............. 438/57, 438/60, 70–75, 144–145; 257/E27.13–E27.163
See application file for complete search history.

(56) References Cited

U.S. PATENT DOCUMENTS

| 6,147,009 | A | 11/2000 | Grill et al. | |
|---|---|---|---|---|
| 2001/0051405 | A1* | 12/2001 | Sekine | 438/208 |
| 2007/0009717 | A1* | 1/2007 | Wong | 428/209 |
| 2007/0164193 | A1* | 7/2007 | Lee | 250/200 |
| 2008/0105944 | A1* | 5/2008 | Chang et al. | 257/461 |

* cited by examiner

*Primary Examiner*—Michael S Lebentritt
*Assistant Examiner*—Daniel Whalen
(74) *Attorney, Agent, or Firm*—Saliwanchik, Lloyd & Saliwanchik

(57) ABSTRACT

An image sensor and fabricating method thereof are provided. The image sensor can include a color filter on a semiconductor substrate, a microlens on the color filter layer, and a carbon-doped low temperature oxide layer on the microlens.

8 Claims, 3 Drawing Sheets

IMAGE SENSOR AND FABRICATING METHOD THEREOF

CROSS-REFERENCE TO RELATED APPLICATION

The present application claims the benefit under 35 U.S.C. §119 of Korean Patent Application No. 10-2006-0132387, filed Dec. 22, 2006, which is hereby incorporated by reference in its entirety.

BACKGROUND

In order to obtain a brighter and clearer image, a complimentary metal oxide semiconductor (CMOS) image sensor (CIS) needs to condense more light in a light-receiving portion such as a photodiode. A microlens formed using a photoresist (PR) is typically used to condense light in a photodiode. However, since the PR generally has a low hardness, particles generated during a subsequent wafer-sawing process are often lodged into the surface of the PR, causing damage to the microlens.

To prevent damage to the microlens, an undoped silicate glass (USG) is often deposited on the microlens at a low temperature (typically about 180° C.). The deposited material can also be referred to as a low temperature oxide (LTO).

However, the USG, though hard, can be easily cracked. A crack can affect the microlens formed under the USG, making it difficult to obtain a good image.

In addition, the USG typically has a refractive index ranging from 1.48 to 1.53, and incident light is refracted by the USG when reaching the microlens. As a result, the focal length is reduced, meaning that the thickness at a back-end-of-line (BEOL) operation should be reduced.

Thus, there exists a need in the art for an improved image sensor and fabricating method thereof.

BRIEF SUMMARY

Embodiments of the present invention provide an image sensor and a fabricating method thereof. The fabrication yield of the image sensor can be improved by inhibiting the formation of a crack during a wafer-sawing process.

An embodiment provides an image sensor including: a color filter layer on a semiconductor substrate; a microlens on the color filter layer; and a carbon-doped low temperature oxide layer on the microlens.

An embodiment provides a method of fabricating an image sensor. The method includes: forming a color filter layer; forming a microlens on the color filter layer; and forming a carbon-doped low temperature oxide layer on the microlens.

A further embodiment provides a method of fabricating an image sensor including forming a color filter layer; forming an overcoat layer on the color filter layer; forming a microlens on the overcoat layer; and forming a carbon-doped low temperature oxide layer on the microlens.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
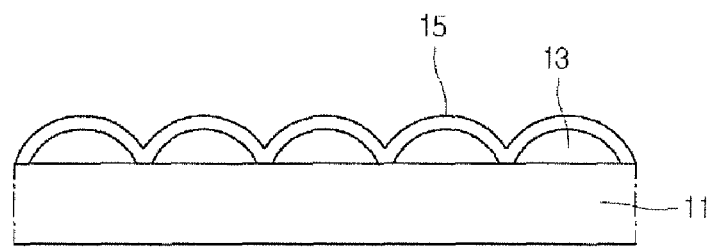
FIG. 1 is a cross-sectional view of an image sensor according to an embodiment of the present invention.

Referring to FIG. 1, in an embodiment, an image sensor can include a color filter layer 11, a microlens 13 formed on the color filter layer 11, and a carbon-doped LTO layer (c-LTO layer) 15 formed on the microlens 13.

In the c-LTO layer 15, some of the Si—O bonds of the $SiO_2$ can include a substituent. The substituent can be, for example, a methyl group ($CH_3$) or a polymethylene group ($(CH_2)_n$ where n is an integer). In addition, the C-LTO layer 15 can have a refractive index from about 1.2 to about 1.48 and can be formed at a temperature from about 20° C. to about 350° C.

The image sensor can further include a light-receiving portion formed on a semiconductor substrate before the color filter layer 11 is formed. For example, the light-receiving portion can be formed of a photodiode.

In an embodiment, an electron-beam (E-beam) or ultra violet (UV) rays can be irradiated on the c-LTO layer 15.

The irradiation of the E-beam or UV rays can break bonds in the c-LTO layer 15 and then form new bonds in the c-LTO layer 15 to improve the hardness of the c-LTO layer 15. For example, the new bonds of the c-LTO layer 15 can be Si—O bonds, Si—H bonds, Si—C bonds, C—C bonds, or C—H bonds.

As a result, damage to the c-LTO layer 15 caused by particles generated during a sawing process can be inhibited. In addition, the c-LTO layer 15 can be inhibited from being cracked, and the microlens 13 formed under the c-LTO layer 15 can be inhibited from being damaged. Accordingly, the fabrication yield of the image sensor can be improved.

The E-beam or UV rays can be irradiated using an energy band ranging from about 1 eV to about 10 eV, or a portion of the energy band. In an embodiment, C—C bonds can be formed at about 3 eV, and C—H bonds can be formed at about 4.5 eV. In addition, the E-beam or UV rays can be irradiated at a temperature ranging from about 0° C. to about 400° C.

In embodiment, an overcoat layer can be formed on the color filter layer 11 under the microlens 13. The overcoat layer can be formed on the color filter layer 11, and then the microlens 13 can be formed on the overcoat layer.

Figure 2:
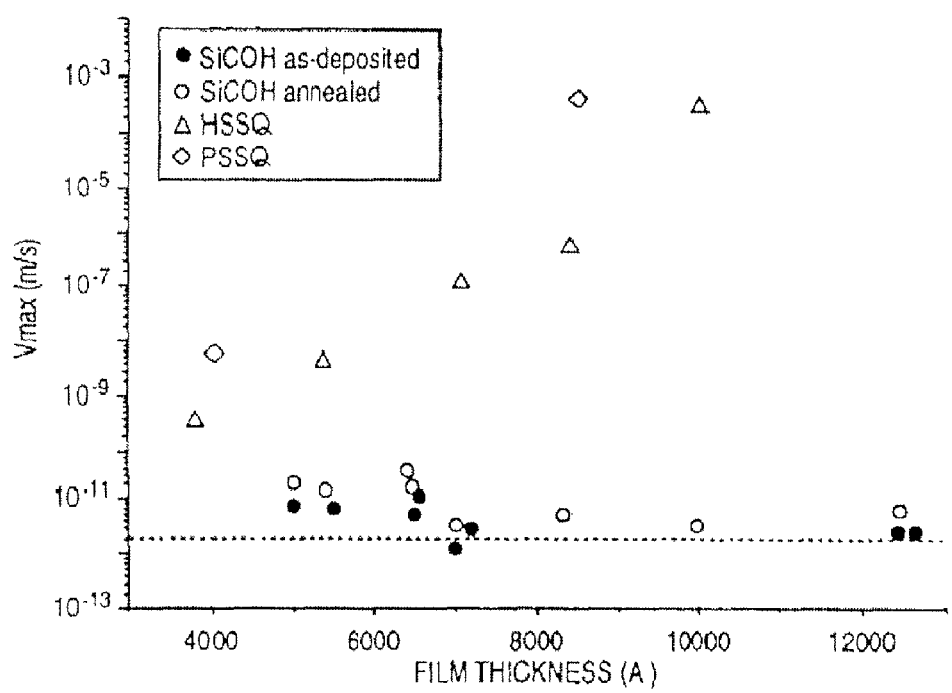
FIG. 2 is a graph illustrating the characteristics of a carbon-doped LTO layer used in an embodiment of the present invention.

FIG. 2 is a graph illustrating the characteristics of a carbon-doped LTO layer used in an image sensor according to an embodiment of the present invention.

Referring to FIG. 2, a crack velocity of a related art USG and a crack velocity of a carbon-doped oxide including a methyl group are illustrated. Fewer cracks are found in the carbon-doped oxide than in the related art USG due to the $CH_3$ or $(CH_2)_n$ that can be included in the carbon-doped oxide. Also, deposition and curing processes on the carbon-doped oxide can be performed at high temperatures. Additionally, since the carbon-doped oxide can be deposited on the microlens, a temperature that does not damage a photoresist (PR) may need to be used.

Figure 3:
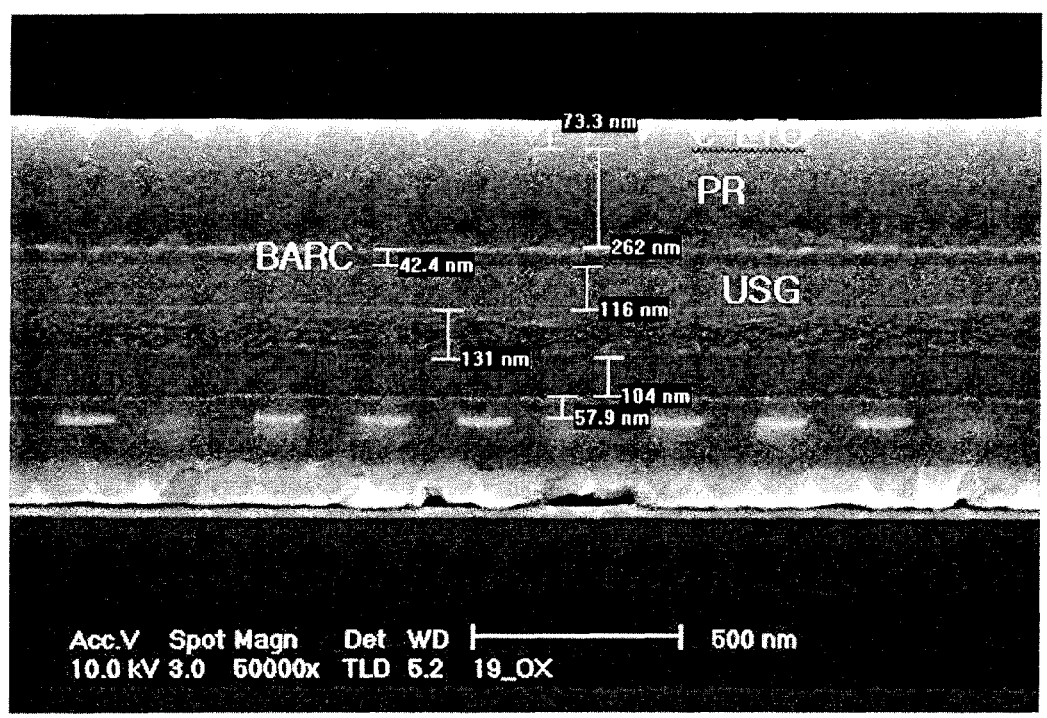
FIGS. 3 and 4 are views illustrating the stability of formation of a carbon-doped LTO layer used in an embodiment of the present invention.
Figure 4:
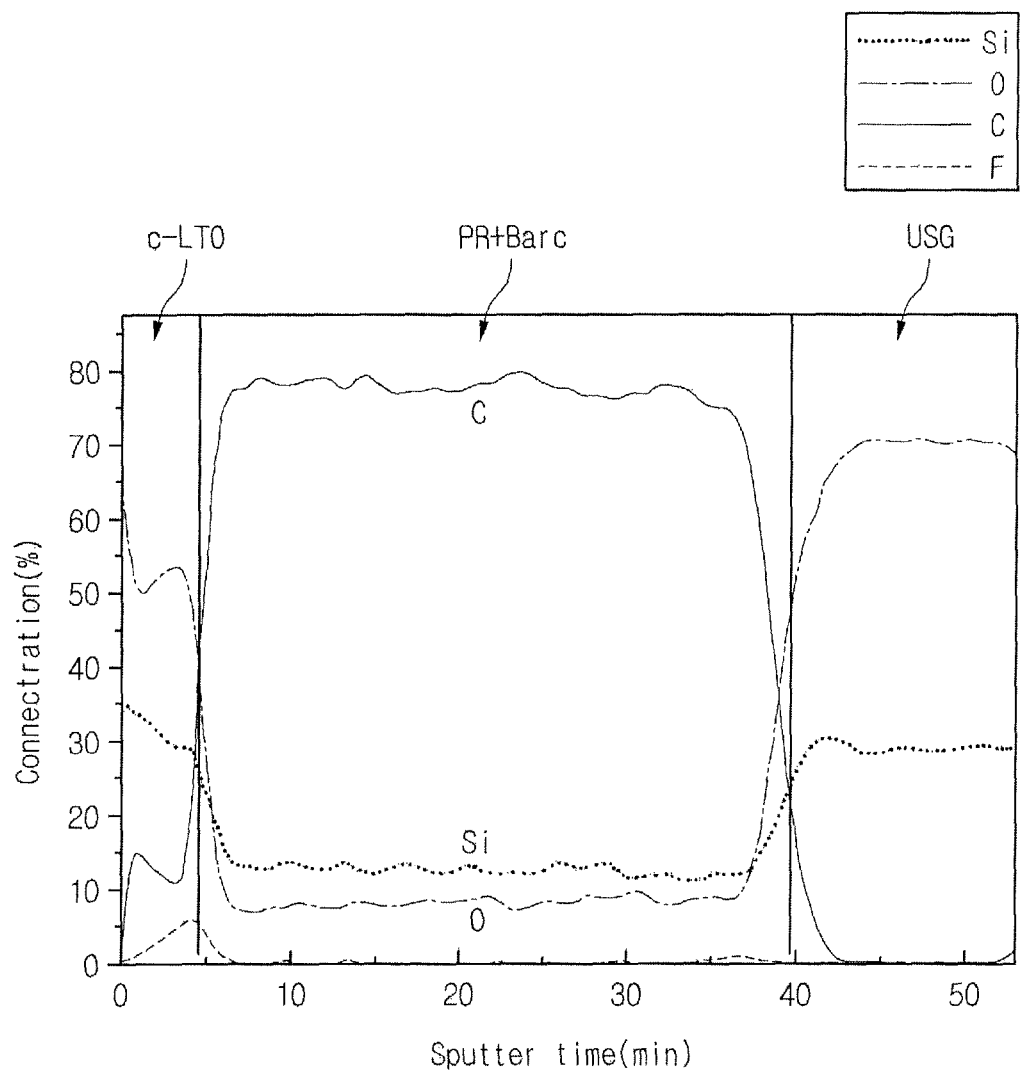

FIGS. 3 and 4 are views illustrating the stability of formation of a c-LTO layer used in an image sensor according to an embodiment of the present invention.

FIG. 3 illustrates an image of the c-LTO layer that can be deposited on a PR and observed using a scanning electron microscope (SEM). FIG. 3 shows an embodiment in which the deposition of the c-LTO layer was desirably deposited, and the thickness of the PR was not changed after the deposition. In the embodiment, the temperature of the deposition was about 70° C., and $Si(CH_3)_3H$, He, and $O_2$ gases were used. The refractive index of the c-LTO layer can be between about 1.4 and about 1.48.

FIG. 4 illustrates an auger electron spectroscopy depth profile of an embodiment with a c-LTO layer deposited on a structure of a USG/PR with a bottom anti-reflective coating (BARC). In this embodiment, the c-LTO layer can be formed on the surface of the PR and does not permeate into the PR. In addition, while the USG can have a carbon concentration of about 0%, the c-LTO layer can have a carbon concentration ranging from about 10% to about 20%.

According to embodiments of the present invention, formation of a crack caused by a wafer sawing process can be inhibited, and the fabrication yield of an image sensor can be improved.

Since the refractive index (n=about 1.2 to about 1.48) of the c-LTO can be much lower than that of the related art LTO (n=about 1.48 to about 1.53), the reduction of the focal length of light can be minimized. Therefore, it is not necessary to reduce the thickness at a back-end-of-line (BEOL) operation.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating an image sensor, comprising:
   forming a color filter layer on a substrate;
   forming a microlens on the color filter layer; and
   forming a carbon-doped low temperature oxide layer on the microlens.

2. The method according to claim 1, further comprising irradiating the carbon-doped low temperature oxide layer with an electron beam (E-beam) or ultra violet (UV) rays.

3. The method according to claim 2, wherein irradiating the carbon-doped low temperature oxide layer is performed at an energy of about 1 eV to about 10 eV.

4. The method according to claim 2, wherein irradiating the carbon-doped low temperature oxide layer comprises breaking bonds and forming new bonds in the carbon-doped low temperature oxide layer.

5. The method according to claim 4, wherein the new bonds comprise Si—O bonds, Si—H bonds, Si—C bonds, C—C bonds, or C—H bonds.

6. The method according to claim 1, wherein the carbon-doped low temperature oxide layer comprises a methyl group ($CH_3$), or a polymethylene group ($(CH_2)_n$).

7. The method according to claim 1, wherein the carbon-doped low temperature oxide layer has a refractive index of from about 1.2 to about 1.48.

8. The method according to claim 1, wherein forming carbon-doped low temperature oxide layer is performed at a temperature of from about 20° C. to about 350° C.

* * * * *